United States Patent
Kim

(10) Patent No.: US 8,564,341 B2
(45) Date of Patent: Oct. 22, 2013

(54) DLL CIRCUIT AND METHOD OF CONTROLLING THE SAME

(75) Inventor: Kyoung Nam Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 27 days.

(21) Appl. No.: 13/152,449

(22) Filed: Jun. 3, 2011

(65) Prior Publication Data

US 2011/0234281 A1   Sep. 29, 2011

Related U.S. Application Data

(62) Division of application No. 11/647,379, filed on Dec. 29, 2006, now Pat. No. 7,982,511.

(30) Foreign Application Priority Data

| Feb. 9, 2006 | (KR) | 10-2006-0012358 |
|---|---|---|
| Jun. 29, 2006 | (KR) | 10-2006-0059656 |

(51) Int. Cl.
  *H03L 7/06* (2006.01)
(52) U.S. Cl.
  USPC .................................. 327/156; 327/158
(58) Field of Classification Search
  USPC .................................. 327/156, 158
  See application file for complete search history.

(56) References Cited

U.S. PATENT DOCUMENTS

| 6,333,896 B1 | 12/2001 | Lee |
| 6,366,148 B1 * | 4/2002 | Kim ............................ 327/262 |
| 6,621,315 B2 | 9/2003 | Heo et al. |
| 6,980,479 B2 | 12/2005 | Park |
| 6,982,579 B2 | 1/2006 | Lee |
| 7,027,352 B2 | 4/2006 | Jung |
| 2003/0111676 A1 | 6/2003 | Cho et al. |
| 2006/0120207 A1 | 6/2006 | Lee |
| 2006/0132203 A1 | 6/2006 | Lee |
| 2008/0191749 A1 * | 8/2008 | Haimzon ..................... 327/105 |

FOREIGN PATENT DOCUMENTS

| JP | 2005116167 | 4/2005 |
| JP | 2005243168 | 9/2005 |
| KR | 1019900012458 | 8/1990 |
| KR | 1020010008836 | 2/2001 |
| KR | 102001003038 | 6/2001 |
| KR | 1020030078307 | 10/2003 |
| KR | 100757921 | 9/2007 |

* cited by examiner

*Primary Examiner* — Lincoln Donovan
*Assistant Examiner* — Diana J Cheng
(74) *Attorney, Agent, or Firm* — Venable LLP; Jeffri A. Kaminski

(57) ABSTRACT

A delayed lock loop (DLL) circuit includes: a phase conversion control unit configured to latch and drive a phase comparison signal in response to the input of a delay enable signal, and output the driven signal as a phase conversion control signal. A phase converting unit configured to control the phase of a delay clock on the basis of the phase conversion control signal, and transmit the controlled delay clock to a delay compensating unit.

16 Claims, 9 Drawing Sheets

DLL CIRCUIT AND METHOD OF CONTROLLING THE SAME

CROSS-REFERENCE TO RELATED APPLICATIONS

This application is a divisional of U.S. patent application Ser. No. 11/647,379, filed Dec. 29, 2006, which claims benefit of Korean Patent Application Nos. 10-2006-0012358 filed Feb. 9, 2006 and 10-2006-0059656 filed Jun. 29, 2006, in the Korean Intellectual Property Office, the subject matter of which these applications are incorporated herein by reference in its entirety

BACKGROUND

1. Technical Field

The present invention relates to a delay locked loop (DLL) circuit and a method of controlling the same, and more particularly, to a DLL circuit and a method of controlling the same capable of shortening a clock delay locking time and reducing a device area.

2. Related Art

In general, DLL circuits are used to provide an internal clock, whose phase leads the phase of a reference clock, by converting an external clock by a predetermined amount of time. Generally, the internal clock is generated to operate in synchronization with data in a semiconductor memory apparatus having a high degree of integration, such as a Synchronous Dynamic Random Access Memory (SDRAM).

More specifically, when an external clock is input to a clock input buffer by an input pin, the clock input buffer generates an internal clock. Then, the internal clock controls a data output buffer which outputs data. The internal clock is delayed from the external clock by a predetermined amount of time by the clock input buffer, and the data output from the data output buffer is also delayed by a predetermined amount of time.

Therefore, the output data is delayed as compared with the external clock by a large amount of time. That is, the output data access time required to output data after the external clock is input is prolonged.

In order to solve this problem, a DLL circuit is used to make the phase of the internal clock lead the phase of the external clock by a predetermined amount of time. As a result, data is output without being delayed as compared with the external clock. That is, the DLL circuit receives an external clock and generates an internal clock whose phase leads the phase of the external clock by a predetermined amount of time, and the internal clock is used as a reference clock in, for example, a data output buffer.

Next, a DLL circuit according to the related art will be described with reference to the accompanying drawings.

FIG. 1 is a block diagram of a DLL circuit according to the related art.

As shown in FIG. 1, a DLL circuit 1 includes: a clock buffer 10 that changes the amplitude of an external clock clk_ext, to generate a reference clock clk_ref; a delay unit 20 that delays the reference clock clk_ref in a push or pull manner in response to the input of a delay control signal dc1 to generate a delay clock clk_dly, and transmits the generated delay clock clk_dly to a data output buffer 30 so as to synchronize with data transmitted from a memory cell; a delay compensating unit 40 that delays the delay clock clk_dly to generate a feedback clock clk_fb in order to compensate for a delay time produced by delay elements provided on a transmission path of the delay clock clk_dly to the outside of a semiconductor integrated circuit; a phase comparing unit 50 that compares the phase of the reference clock clk_ref with the phase of the feedback clock clk_fb to generate a phase comparison signal pcm; and a delay control unit 60 that generates the delay control signal dc1 on the basis of the phase comparison signal pcm and transmits the delay control signal dc1 to the delay unit 20.

When the external clock clk_ext is transmitted to the clock buffer 10 of the semiconductor integrated circuit having the DLL circuit 1, the clock buffer 10 changes the external clock clk_ext having a small amplitude into the reference clock clk_ref having a large amplitude, and transmits the reference clock clk_ref to the delay unit 20. Then, the delay unit 20 delays the reference clock clk_ref by a predetermined amount of time and outputs the delayed clock as the delay clock clk_dly.

The delay compensating unit 40 has pre-calculated delay values of delay elements provided on a path through which the delay clock clk_dly transmitted from the delay unit 20 is transmitted to the data output buffer 30. Therefore, the delay compensating unit 40 gives a predetermined delay time, for compensating for the delay values of the delay elements, to the delay clock clk_dly to generate the feedback clock clk_fb. Then, the phase comparing unit 50 detects the phase difference between the reference clock clk_ref and the feedback clock clk_fb to generate the phase comparison signal pcm. The delay control unit 60 generates the delay control signal dc1 in response to the input of the phase comparison signal pcm to instruct the delay unit 20 to perform a push or pull delay operation. The delay unit 20 gives a positive or negative delay time to the reference clock clk_ref on the basis of the delay control signal dc1.

FIGS. 2A to 2C are timing charts illustrating the operation of the DLL circuit shown in FIG. 1.

The reference clock clk_ref, the feedback clock clk_fb, and a locked clock having a rising edge time identical to those of the reference clock clk_ref and the feedback clock clk_fb are shown in FIGS. 2A to 2C.

FIG. 2A shows the feedback clock clk_fb whose phase leads the phase of the reference clock clk_ref when the external clock clk_ext is a high-frequency signal. In this case, a phase difference Trf between the reference clock clk_ref and the feedback clock clk_fb is larger than a phase difference Tfl between the feedback clock clk_fb and the locked clock.

FIG. 2B shows the reference clock clk_ref whose phase leads the phase of the feedback clock clk_fb when the external clock clk_ext is a high-frequency signal. In this case, the phase difference Trf between the reference clock clk_ref and the feedback clock clk_fb is smaller than the phase difference Tfl between the feedback clock clk_fb and the locked clock. That is, in FIG. 2B, the phase difference Tfl between the feedback clock clk_fb and the locked clock is larger than that shown in FIG. 2A, and thus a larger amount of delay time should be given to the reference clock clk_ref until the phase difference Tfl between the feedback clock clk_fb and the locked clock is zero.

FIG. 2C shows the waveforms of the reference clock clk_ref and the feedback clock clk_fb when a low-frequency external clock clk_ext is input to the DLL circuit for generating the reference clock clk_ref and the feedback clock clk_fb. In this case, the phase difference Trf between the reference clock clk_ref and the feedback clock clk_fb is the same as shown in FIG. 2A. This is because the delay time given to the reference clock clk_ref by the delay unit 20 and the delay time given to the delay clock clk_dly by the delay compensating unit 40 are the same regardless of the frequency. However, the phase difference Tfl between the feedback clock clk_fb and the fixed clock is considerably larger than that shown in FIG. 2A. That is, when a low-frequency clock is input to the DLL circuit, a larger amount of delay time should be given to the reference clock clk_ref until the phase difference Tfl between the feedback clock clk_fb and the locked clock is zero.

As described above, in the delay locking operation of the DLL circuit with respect to the internal clock, when the phase of the reference clock leads the phase of the feedback clock, a larger amount of delay time is given to the reference clock compared to when the phase of the feedback clock leads the phase of the reference clock. In addition, the lower the frequency of the external clock becomes, the larger the amount of delay time to be given to the reference clock by the delay unit becomes. When the amount of delay time given to the reference clock becomes large, it takes the DLL circuit a lot of time to perform a clock delay locking operation, resulting in the deterioration of the efficiency of the DLL circuit. In order to give the larger amount of delay time to the reference clock, a larger number of delay elements should be provided in the delay unit, which results in an increase in the occupation area of DLL circuit.

SUMMARY

Embodiments of the present invention provide a DLL circuit and a method of controlling the same, which reduces the amount of delay time given to lock a reference clock and a feedback clock, which reduces the number of delay elements provided in a delay unit, which results in an increase of an area margin.

In a first embodiment of the present invention, a DLL circuit includes: a phase conversion control unit configured to latch and drive a phase comparison signal in response to the input of a delay enable signal, and output the driven signal as a phase conversion control signal; and a phase converting unit configured to control the phase of a delay clock on the basis of the phase conversion control signal, and transmit the controlled delay clock to a delay compensating unit.

In a second embodiment of the present invention, a DLL circuit includes: a phase conversion control unit configured to receive a phase comparison signal whose level is determined by the phase relationship between a reference clock and a feedback clock, and output a phase conversion control signal; and a phase converting unit configured to invert a delay clock when the phase of the reference clock leads the phase of the feedback clock, and output the delay clock without inversion when the phase of the feedback clock leads the phase of the reference clock on the basis of the phase conversion control signal.

In a third embodiment of the present invention, a DLL circuit includes: a phase conversion control unit configured to generate first and second phase conversion control signals according to whether the frequency of an external clock exceeds a predetermined frequency; and a phase converting unit configured to control the phase of a delay clock according to whether the first phase conversion control signal or the second phase conversion control signal is enabled, and transmit the controlled delay clock to a delay compensating unit.

In a fourth embodiment of the present invention, a DLL circuit includes: a phase conversion control unit configured to generate first and second phase conversion control signals according to whether or not a plurality of CAS latency signals generated according to the length of CAS latency or a plurality of test signals are enabled; and a phase converting unit configured to invert a delay clock when the length of the CAS latency is smaller than a predetermined length, and output the delay clock without inversion when the length of the CAS latency is equal to or larger than the predetermined length on the basis of the first and second phase conversion control signals.

In a fifth embodiment of the present invention, a method of controlling a DLL circuit includes: latching and driving a phase comparison signal in response to the input of a delay enable signal, and outputting the driven signal as a phase conversion control signal; and controlling the phase of a delay clock on the basis of the phase conversion control signal, and transmitting the controlled delay clock to a delay compensating unit.

In a sixth embodiment of the present invention, a method of controlling a DLL circuit includes: receiving a phase comparison signal whose level is determined by the phase relationship between a reference clock and a feedback clock, and outputting a phase conversion control signal; and inverting a delay clock when the phase of the reference clock leads the phase of the feedback clock and, outputting the delay clock without inversion when the phase of the feedback clock leads the phase of the reference clock on the basis of the phase conversion control signal.

In a seventh embodiment of the invention, a method of controlling a DLL circuit includes: generating first and second phase conversion control signals according to whether the frequency of an external clock is larger than a predetermined frequency; and controlling the phase of a delay clock according to whether the first phase conversion control signal or the second phase conversion control signal is enabled and outputting the controlled delay clock to a delay compensating unit.

In an eighth embodiment of the invention, a method of controlling a DLL circuit includes: generating first and second phase conversion control signals according to whether or not a plurality of CAS latency signals generated according to the length of CAS latency or a plurality of test signals are enabled; and inverting a delay clock when the length of the CAS latency is smaller than a predetermined length, and outputting the delay clock without inversion when the length of the CAS latency is equal to or larger than the predetermined length on the basis of the first and second phase conversion control signals.

DESCRIPTION OF EXEMPLARY EMBODIMENT

Exemplary embodiments of the present invention will now be described in detail with reference to the accompanying drawings.

Figure 1:
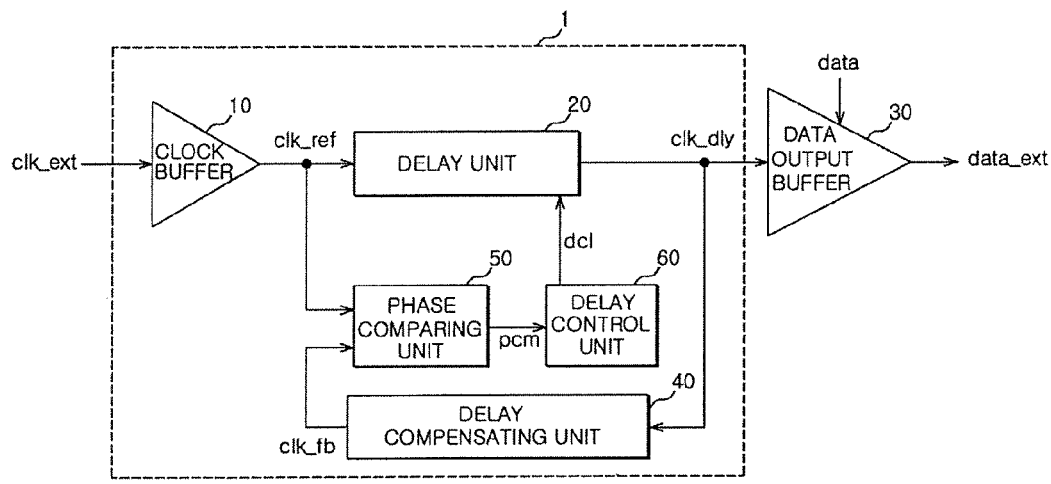
FIG. 1 is a block diagram of a DLL circuit according to the related art.
Figure 2A:
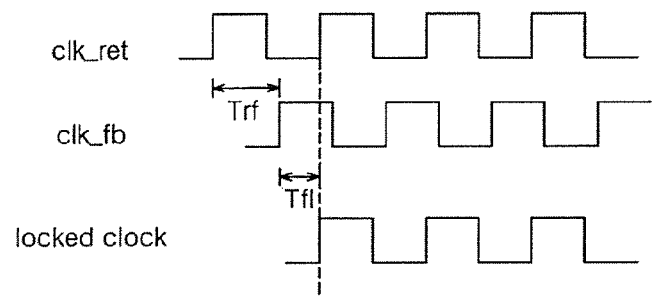
FIGS. 2A to 2C are timing charts illustrating the operation of the DLL circuit according to the related art.
Figure 2B:
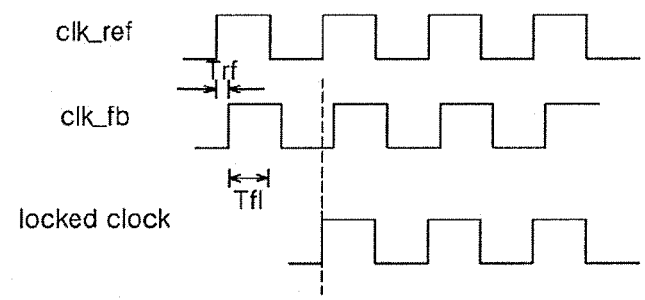
Figure 2C:
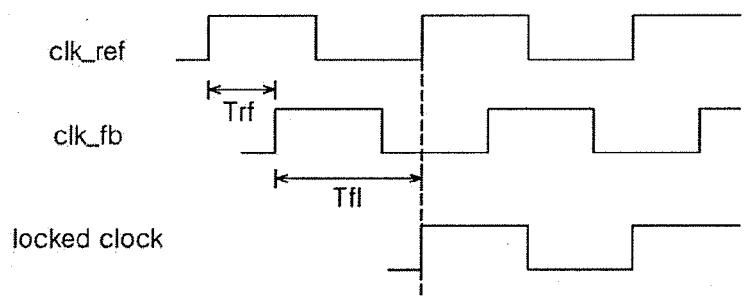
Figure 3:
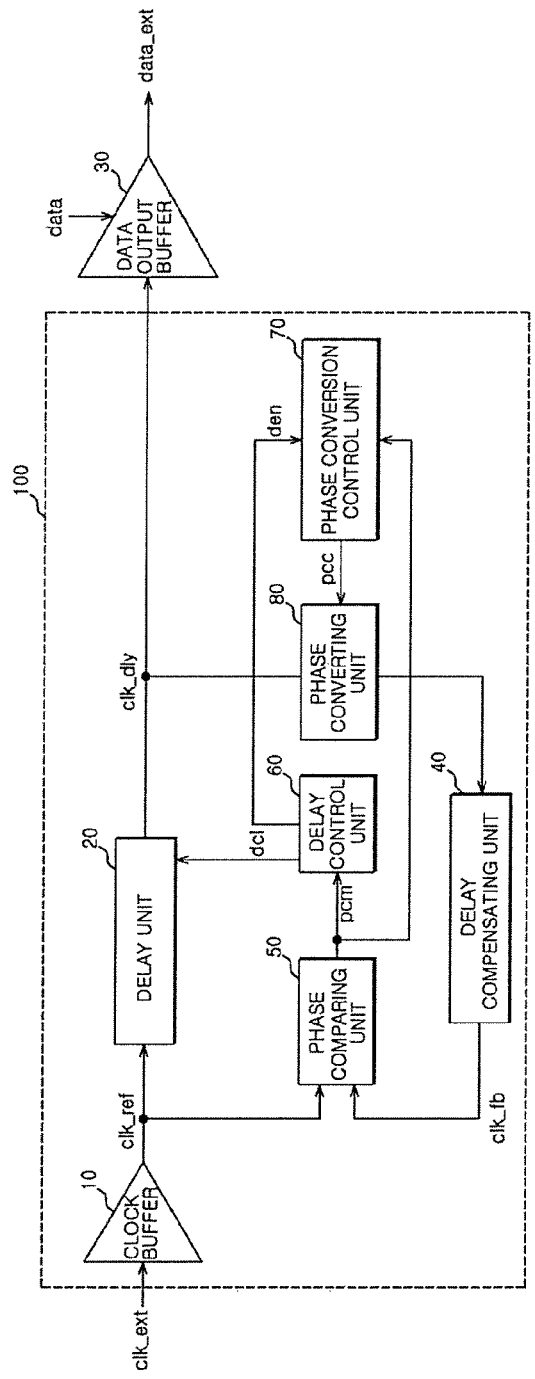
FIG. 3 is a block diagram illustrating a DLL circuit according to an embodiment of the present invention.

FIG. 3 is a block diagram illustrating the structure of a DLL circuit according to a first embodiment of the present invention.

As shown in FIG. 3, a DLL circuit 100 includes: a clock buffer 10 that changes the amplitude of an external clock clk_ext to generate a reference clock clk_ref; a delay unit 20 that delays the reference clock clk_ref in a push or pull manner in response to the input of a delay control signal dc1 to generate a delay clock clk_dly, and transmits the generated delay clock clk_dly to a data output buffer 30 in synchronization with data transmitted from a memory cell; a phase conversion control unit 70 that latches and drives a phase comparison signal pcm in response to a delay enable signal den, and outputs the driven signal as a phase conversion control signal pcc; a phase converting unit 80 that controls the phase of the delay clock clk_dly in response to the phase conversion control signal pcc; a delay compensating unit 40 that delays a clock output from the phase converting unit 80 to generate a feedback clock clk_fb in order to compensate for a delay time produced by delay elements provided on a transmission path of the delay clock clk_dly to the outside of a semiconductor integrated circuit; a phase comparing unit 50 that compares the phase of the reference clock clk_ref with the phase of the feedback clock clk_fb to generate the phase comparison signal pcm; and a delay control unit 60 that generates the delay control signal dc1 in response to the phase comparison signal pcm, and transmits the delay control signal dc1 to the delay unit 20.

The delay enable signal den is generated inside the delay control unit 60, and is used to activate the delay control unit 60. In an initial operation of the DLL circuit 100, the delay enable signal den is disabled, and thus the delay control signal dc1 is not generated, which causes the delay unit 20 not to delay the reference clock clk_ref. But, when the delay enable signal den is enabled, the delay control signal dc1 is generated, which causes the delay unit 20 to delay the reference clock clk_ref.

When the external clock clk_ext is transmitted to the clock buffer 10 from outside the semiconductor integrated circuit having the DLL circuit 100, the clock buffer 10 converts the external clock clk_ext, that has a small amplitude, into the reference clock clk_ref having a large amplitude, and transmits the reference clock clk_ref to the delay unit 20. Then, the delay unit 20 delays the reference clock clk_ref by a predetermined amount of time and outputs the delayed clock as the delay clock clk_dly.

The delay compensating unit 40 has pre-calculated delay values of delay elements provided on a path through which the delay clock clk_dly is transmitted to the data output buffer 30. Therefore, the delay compensating unit 40 gives a predetermined delay time, for compensating for the delay values of the delay elements, to the clock transmitted from the phase converting unit 80 to generate the feedback clock clk_fb. Then, the phase comparing unit 50 detects the phase difference between the reference clock clk_ref and the feedback clock clk_fb to generate the phase comparison signal pcm. The delay control unit 60 generates the delay control signal dc1 in response to the input of the phase comparison signal pcm. The delay control signal dc1 instructs the delay unit 20 to perform a push or pull delay. The delay unit 20 gives a positive or negative delay time to the reference clock clk_ref on the basis of the delay control signal dc1.

The phase comparison signal pcm is also transmitted to the phase conversion control unit 70. The phase comparison signal pcm includes information about the phase relationship between the reference clock clk_ref and the feedback clock clk_fb in its voltage level. The phase conversion control unit 70 latches and drives the phase comparison signal pcm in response to the input of the delay enable signal den and outputs the driven signal as the phase conversion control signal pcc.

When the phase converting unit 80 receives information from the phase conversion control signal pcc indicating that the phase of the reference clock clk_ref leads the phase of the feedback clock clk_fb, the phase converting unit 80 inverts the delay clock clk_dly and transmits the inverted delay clock to the delay compensating unit 40. In contrast, when the phase converting unit 80 receives information from the phase conversion control signal pee indicating that the phase of the feedback clock clk_fb leads the phase of the reference clock clk_ref, the phase converting unit 80 drives the delay clock clk_dly without inversion and transmits the driven delay clock to the delay compensating unit 40.

Figure 4:
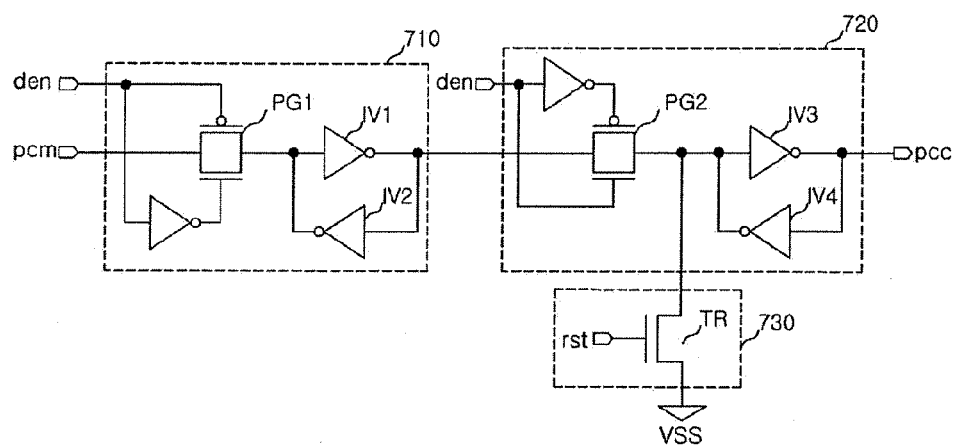
FIG. 4 is a circuit diagram of the phase conversion control unit shown in FIG. 3.

FIG. 4 shows a circuit diagram of the phase conversion control unit shown in FIG. 3.

The phase conversion control unit 70 includes: a first latch unit 710 that latches the phase comparison signal pcm in response to the input of the delay enable signal den; a second latch unit 720 that latches the signal transmitted from the first latch unit 710 in response to the input of the delay enable signal den; and an initializing unit 730 that initializes an output signal of the phase conversion control unit 70 in response to the input of a reset signal rst.

The first latch unit 710 includes a first pass gate PG1 that passes the phase comparison signal pcm on the basis of the delay enable signal den, and first and second inverters IV1 and IV2 that are formed in a latch structure with respect to the signal passing through the first pass gate PG1.

The second latch unit 720 includes a second pass gate PG2 that passes the signal transmitted from the first latch unit 710 on the basis of the delay enable signal den, and third and fourth inverters IV3 and IV4 that are formed in a latch structure with respect to the signal passing through the second pass gate PG2.

The initializing unit 730 includes a transistor TR that transmits the output signal of the second pass gate PG2 of the second latch unit 720 to the ground terminal according to whether the reset signal rst is enabled.

When the delay enable signal den input to the phase conversion control unit 70 having the above-mentioned structure is disabled, the first pass gate PG1 of the first latch unit 710 is turned on, and the second pass gate PG2 of the second latch unit 720 is turned off, which causes the phase comparison signal pcm to be stored in the latch structure formed by the first and second inverters IV1 and IV2.

On the other hand, when the delay enable signal den is enabled, the first pass gate PG1 of the first latch unit 710 is turned off, and the second pass gate PG2 of the second latch unit 720 is turned on, which causes the signal output from the first latch unit 710 to be stored in the latch structure formed by the third and fourth inverters IV3 and IV4.

The first and second latch units 710 and 720 are operated on the basis of the delay enable signal den for the following reason: since the phase comparison signal pcm is a variable signal, in the initial operation of the DLL circuit 100, the phase conversion control signal pee is generated according to the value of the phase comparison signal pcm to prevent a frequent variation in the level of the phase conversion control signal pcc, thereby stabilizing the operation of the phase converting unit 80.

The initializing unit 730 is provided to initialize the phase conversion control signal pcc as a high-level signal on the basis of the reset signal rst in the initializing operation of the DLL circuit 100.

Figure 5:
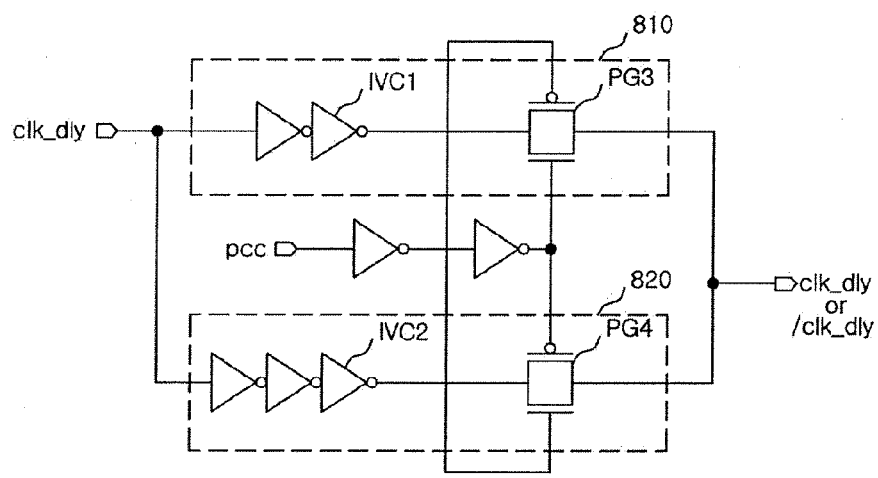
FIG. 5 is a circuit diagram of the phase converting unit shown in FIG. 3.

FIG. 5 is a circuit diagram of the phase converting unit shown in FIG. 3.

The phase converting unit 80 shown in FIG. 5 includes a non-inverting unit 810 that outputs the delay clock clk_dly without inversion on the basis of the phase conversion control signal pcc, and an inverting unit 820 that inverts the delay clock clk_dly on the basis of the phase conversion control signal pcc and outputs the inverted signal.

The non-inverting unit 810 includes a first inverter chain IVC1 composed of an even-numbered set of inverters connected in series to each other to output the delay clock clk_dly without inversion, and a third pass gate PG3 that passes the output signal of the first inverter chain IVC1 on the basis of the phase conversion control signal pcc.

The inverting unit 820 includes a second inverter chain IVC2 composed of an odd-numbered set of inverters connected in series to each other to invert the delay clock clk_dly, and a fourth pass gate PG4 that passes the output signal of the second inverter chain IVC2 on the basis of the phase conversion control signal pcc.

When the phase conversion control signal pcc is at a high level, the third pass gate PG3 of the non-inverting unit 810 is turned on, and the fourth gate PG4 of the inverting unit 820 is turned off, which causes the output signal of the phase converting unit 80 to have the same phase as the delay clock clk_dly. On the other hand, when the phase conversion control signal pcc is at a low level, the third pass gate PG3 of the non-inverting unit 810 is turned off, and the fourth gate PG4 of the inverting unit 820 is turned on, which causes the output signal of the phase converting unit 80 to be an inverted clock/clk_dly of the delay clock clk_dly.

That is, when the phase of the feedback clock clk_fb leads the phase of the reference clock clk_ref, the phase comparison signal pcm and the phase conversion control signal pee are at a high level, and thus the output signal of the phase converting unit 80 becomes the same clock as the delay clock clk_dly. On the other hand, when the phase of the reference clock clk_ref leads the phase of the feedback clock clk_fb, the phase comparison signal pcm and the phase conversion control signal pee are at a low level, and thus the output signal of the phase converting unit 80 becomes the inverted clock/clk_dly of the delay clock clk_dly.

Figure 6:
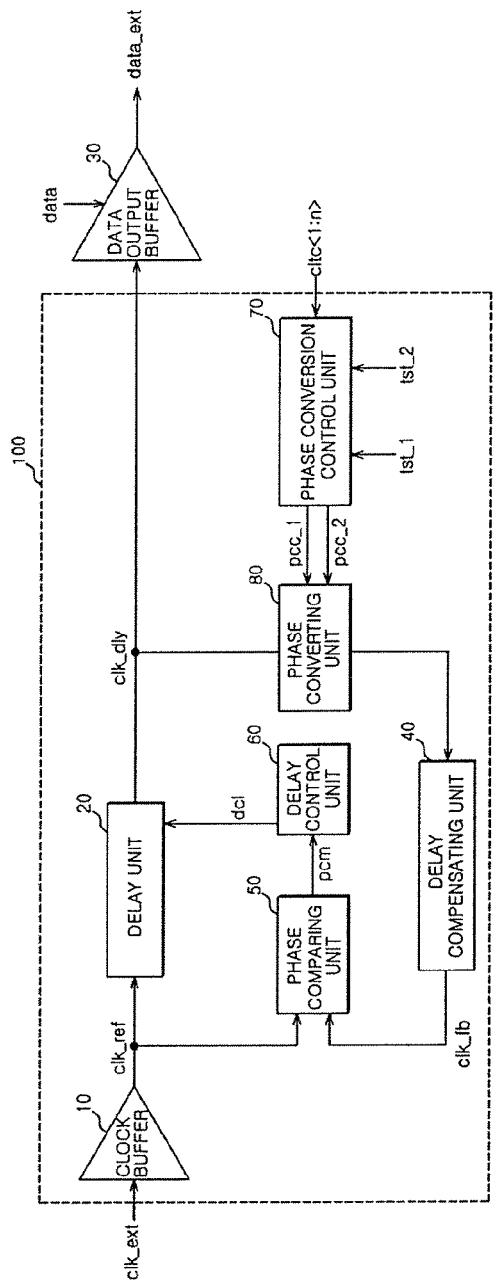
FIG. 6 is a block diagram illustrating a DLL circuit according to another embodiment of the present invention.

FIG. 6 is a block diagram illustrating the structure of a DLL circuit according to a second embodiment of the present invention.

As shown in FIG. 6, a DLL circuit 100 according to the second embodiment is similar to the DLL circuit according to the first embodiment shown in FIG. 3 except that the DLL circuit 100 includes: a phase conversion control unit 70 that generates first and second phase conversion control signals pcc_1 and pcc_2 according to whether n CAS latency signals cltc<1:n> generated according to the length of CAS latency or two test signals tst_1 and tst_2 are enabled; and a phase converting unit 80 that controls the phase of the delay clock clk_dly on the basis of whether the first and second phase conversion control signals pcc_1 and pcc_2 are enabled.

The CAS latency signals cltc<1:n> are used to indicate whether the frequency of the external clock clk_ext exceeds a predetermined frequency. When the length of the CAS latency of a semiconductor integrated circuit having the DLL circuit is larger than a predetermined length, which is a reference length, the external clock clk_ext may be regarded as a high-frequency signal. On the other hand, when the length of the CAS latency is smaller than the predetermined length, the external clock clk_ext may be regarded as a low-frequency signal. In this case, the CAS latency signals cltc<1:n> may be replaced with other signals in order to determine whether the external clock clk_ext is a high-frequency signal or a low-frequency signal.

When the frequency of the external clock clk_ext is higher than the predetermined frequency, the phase conversion control unit 70 enables the first phase conversion control signal pcc_1 and outputs the enabled signal. As the first phase conversion control signal pcc_1 is enabled, the phase converting unit 80 outputs the delay clock clk_dly without inverting the phase thereof. On the other hand, when the frequency of the external clock clk_ext is lower than the predetermined frequency, the phase conversion control unit 70 enables the second phase conversion control signal pcc_2 and outputs the enabled signal. As the second phase conversion control signal pcc_2 is enabled, the phase converting unit 80 inverts the delay clock clk_dly and outputs the inverted clock.

Tests are performed in various ways during the design of the DLL circuit. The DLL circuit may be configured such that it receives a test mode in order to selectively invert the delay clock clk_dly and transmit the inverted clock or the non-inverted clock to a delay compensating unit 40 in the test. Therefore, the phase conversion control unit 70 is configured to generate the first and second phase conversion control signals pcc_1 and pcc_2 according to the test mode, as well as according to whether the external clock clk_ext has a high frequency or a low frequency.

Figure 7:
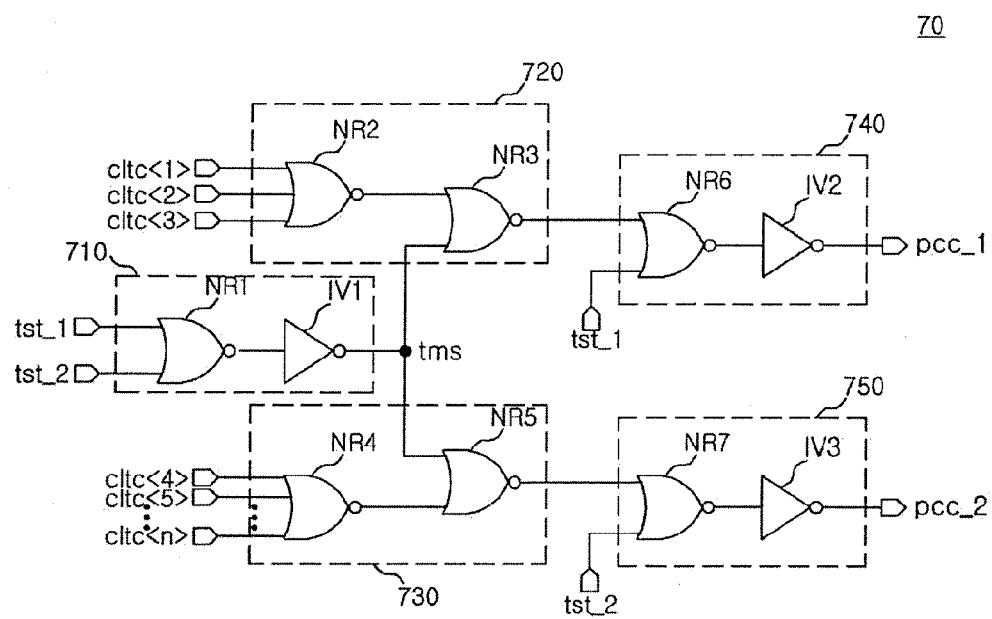
FIG. 7 is a circuit diagram of the phase conversion control unit shown in FIG. 6.

FIG. 7 is a circuit diagram of the phase conversion control unit shown in FIG. 6.

The phase conversion control unit 70 includes: a test mode setting unit 710 that receives the first and second test signals tst_1 and tst_2 to generate a test mode signal tms; a first signal input unit 720 to which the test mode signal tms and the first to third CAS latency signals cltc<1> to cltc<3> among the n CAS latency signals cltc<1:n> are input; a second signal input unit 730 to which the test mode signal tms and the fourth to n-th CAS latency signals cltc<4> to cltc<n> among the n CAS latency signals cltc<1:n> are input; a first signal generating unit 740 that combines the output signal of the first signal input unit 720 and the first test signal tst_1 to generate the first phase conversion control signal pcc_1; and a second signal generating unit 750 that combines the output signal of the second signal input unit 730 and the second test signal tst_2 to generate the second phase conversion control signal pcc_2.

The test mode setting unit 710 includes a first NOR gate NR1 to which the first and second test signals tst_1 and tst_2 are input, and a first inverter IV1 that inverts the output signal of the first NOR gate NR1 to output the test mode signal tms.

The first signal input unit 720 includes a second NOR gate NR2 to which the first to third CAS latency signals cltc<1> to cltc<3> are input, and a third NOR gate NR3 to which the output signal of the second NOR gate NR2 and the test mode signal tms are input.

The second signal input unit 730 includes a fourth NOR gate NR4 to which the fourth to n-th CAS latency signals cltc<4> to cltc<n> are input, and a fifth NOR gate NR5 to which the output signal of the fourth NOR gate NR4 and the test mode signal tms are input.

The first signal generating unit 740 includes a sixth NOR gate NR6 to which the output signal of the first signal input unit 720 and the first test signal tst_1 are input, and a second inverter IV2 that inverts the output signal of the sixth NOR gate NR6 to output the first phase conversion control signal pcc_1.

The second signal generating unit 750 includes a seventh NOR gate NR7 to which the output signal of the second signal input unit 730 and the second test signal tst_2 are input, and a third inverter IV3 that inverts the output signal of the seventh NOR gate NR7 to output the second phase conversion control signal pcc_2.

In this embodiment, it is assumed that, when the length of the CAS latency is smaller than a reference length of 4, that is, in the range of 1 to 3, the external clock clk_ext is a low-frequency signal and when the length of the CAS latency is in the range of 4 to n, the external clock clk_ext is a high-frequency signal. Meanwhile, in the actual implementation of a DLL circuit, the standard for dividing the low frequency and the high frequency may be different from the above, and the above is just an illustrative example for the convenience of explanation.

The first and second test signals tst_1 and tst_2 are applied in order to enable the first and second phase conversion control signals pcc_1 and pcc_2, respectively, when the DLL circuit is tested. Regardless of the n CAS latency signals cltc<1:n>, when the first test signal tst_1 is enabled, the first phase conversion control signal pcc_1 is enabled. When the second test signal tst_2 is enabled, the second phase conversion control signal pcc_2 is enabled.

According to the above-mentioned structure, if the test signals tst_1 and tst_2 are disabled, when the external clock clk_ext has a low frequency, any one of the first to third CAS latency signals cltc<1> to cltc<3> is enabled, which causes the first phase conversion control signal pcc_1 to be enabled. On the other hand, when the external clock clk_ext has a high frequency, any one of the fourth to n-th CAS latency signals cltc<4> to cltc<n> is enabled, which causes the second phase conversion control signal pcc_2 to be enabled.

Figure 8:
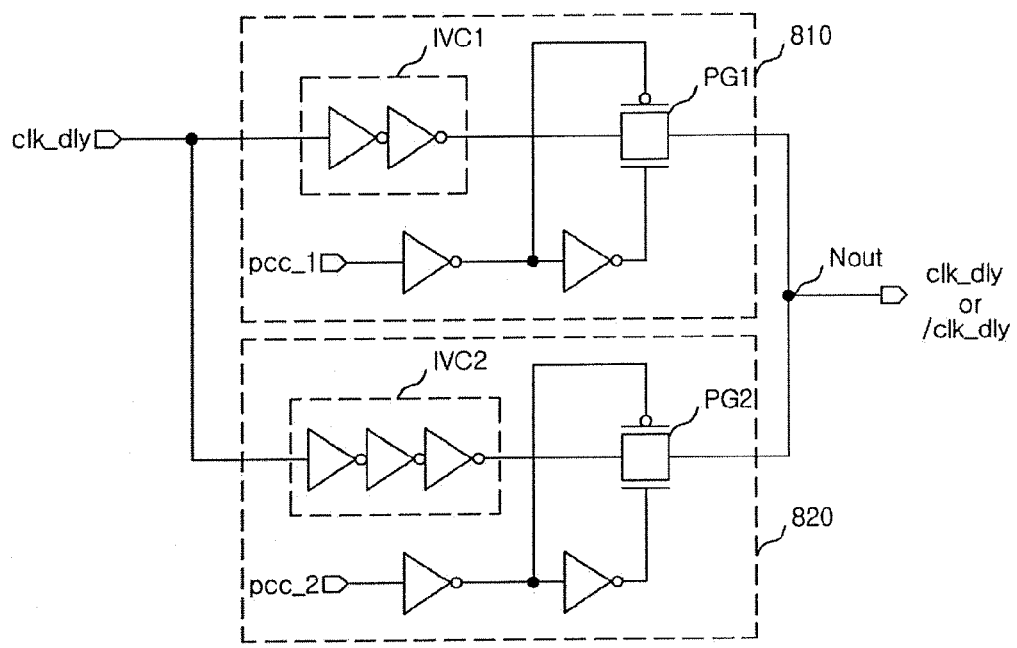
FIG. 8 is a circuit diagram of the phase converting unit shown in FIG. 6.

FIG. 8 is a circuit diagram of the phase converting unit shown in FIG. 6.

The phase converting unit 80 includes a non-inverting unit 810 that outputs the delay clock clk_dly without inversion when the first phase conversion control signal pcc_1 is enabled, and an inverting unit 820 that inverts the delay clock clk_dly and outputs the inverted signal when the second phase conversion control signal pcc_2 is enabled.

The non-inverting unit 810 includes a first inverter chain IVC1 which is composed of an even-numbered set of inverters connected in series to each other and to which the delay clock clk_dly is input; and a first pass gate PG1 that transmits the output signal of the first inverter chain IVC1 to an output node Nout when the first phase conversion control signal pcc_1 is enabled.

The inverting unit 820 includes a second inverter chain IVC2 which is composed of an odd-numbered set of inverters connected in series to each other and to which the delay clock clk_dly is input; and a second pass gate PG2 that transmits the output signal of the second inverter chain IVC2 to the output node Nout when the second phase conversion control signal pcc_2 is enabled.

When the first phase conversion control signal pcc_1 is enabled, the first pass gate PG1 is turned on, which causes the delay clock clk_dly to be transmitted to the output node Nout without being inverted. On the other hand, when the second phase conversion control signal pcc_2 is enabled, the second pass gate PG2 is turned on, which causes the delay clock clk_dly to be transmitted to the output node Nout with the phase thereof inverted. Then, the clock transmitted to the output node Nout is sent to the delay compensating unit 40, and the delay compensating unit 40 uses the clock to generate the feedback clock clk_fb.

Figure 9A:
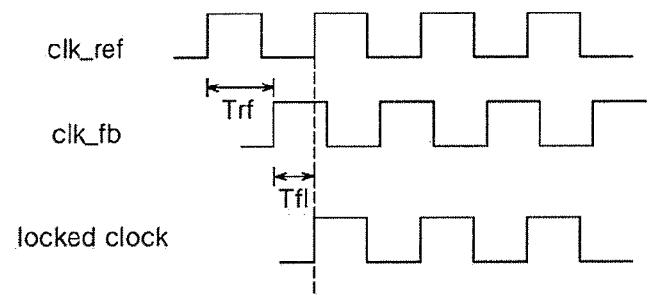
FIGS. 9A to 9B are timing charts illustrating the operation of the DLL circuit according to another embodiment of the present invention.
Figure 9B:
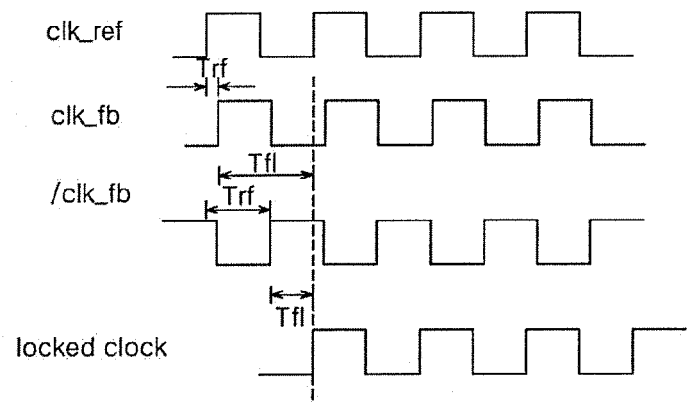

FIGS. 9A and 9B are timing charts illustrating the operation of the DLL circuit according to this embodiment of the present invention.

Figure 9C:
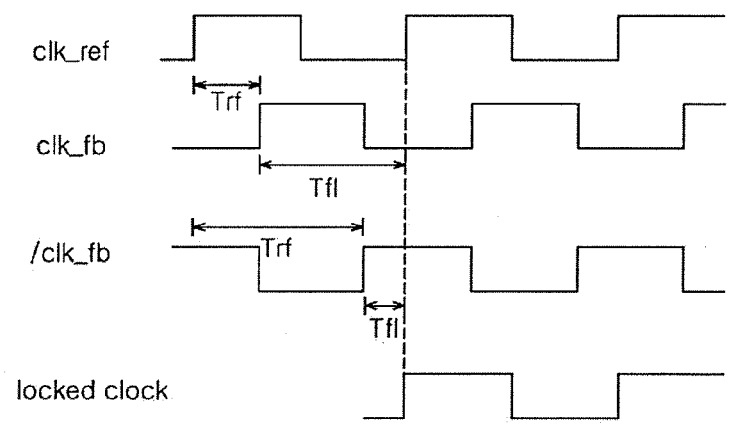

The reference clock clk_ref, the feedback clock clk_fb, and a locked clock having a rising edge time identical to those of the reference clock clk_ref and the feedback clock clk_fb are shown in FIGS. 9A and 9C.

FIG. 9A shows the feedback clock clk_fb whose phase leads the phase of the reference clock clk_ref when the external clock clk_ext is a high-frequency signal. In this case, a phase difference Trf between the reference clock clk_ref and the feedback clock clk_fb is larger than a phase difference Tfl between the feedback clock clk_fb and the locked clock.

FIG. 9B shows the reference clock clk_ref whose phase leads the phase of the feedback clock clk_fb when the external clock clk_ext is a high-frequency signal. In this case, the phase difference Trf between the reference clock clk_ref and the feedback clock clk_fb is smaller than the phase difference Tfl between the feedback clock clk_fb and the locked clock. That is, in FIG. 9B, the phase difference Tfl between the feedback clock clk_fb and the locked clock is larger than that shown in FIG. 9A, and thus a larger amount of delay time should be given to the reference clock clk_ref until the phase difference Tfl between the feedback clock clk_fb and the locked clock is zero. In the DLL circuit according to embodiments of the present invention, the inverted feedback clock/clk_fb is used instead of the feedback clock clk_fb to perform a clock delay locking operation. Therefore, the phase difference Tfl between the inverted feedback clock/clk_fb and the locked clock is smaller than the phase difference Trf between the reference clock clk_ref and the feedback clock clk_fb. Thus, it is possible to reduce the amount of delay time given to the reference clock clk_ref by the delay unit 20 and thus to perform a clock delay locking operation at high speed.

FIG. 9C shows the waveforms of the reference clock clk_ref and the feedback clock clk_fb when a low-frequency external clock clk_ext is input to the DLL circuit for generating the reference clock clk_ref and the feedback clock clk_fb. In this case, the phase difference Trf between the reference clock clk_ref and the feedback clock clk_fb is the same as shown in FIG. 9A. This is because the delay time given to the reference clock clk_ref by the delay unit 20 and the delay time given to the delay clock clk_dly by the delay compensating unit 40 are the same regardless of the frequency. The phase difference Tfl between the feedback clock clk_fb and the locked clock is considerably larger than that shown in FIG. 9A. That is, when the low-frequency clock is input to the DLL circuit, a larger amount of delay time should be given to the reference clock clk_ref until the phase difference Tfl between the feedback clock clk_fb and the locked clock is zero. In the DLL circuit according to embodiments of the present invention, the inverted feedback clock/clk_fb is used instead of the feedback clock clk_fb to perform a clock delay locking operation. Therefore, the phase difference Tfl between the inverted feedback clock/clk_fb and the locked clock is smaller than the phase difference Trf between the reference clock clk_ref and the feedback clock clk_fb. Thus, it is possible to reduce the amount of delay time given to the reference clock clk_ref by the delay unit 20 and thus to perform a clock delay locking operation at high speed.

As described above, the phase difference Tfl between the feedback clock clk_fb and the locked clock means the amount of delay time given to the reference clock clk_ref by the delay unit 20. In the related art, when the phase of the reference clock clk_ref leads the phase of the feedback clock clk_fb, a larger amount of delay time is given to the reference clock clk_ref. Meanwhile, in embodiments of the present invention, since the inverted feedback clock/clk_fb is used, the amount of delay time to be given to the reference clock clk_ref is reduced. As a result, it is possible to shorten the time required to perform a delay locking operation and thus to reduce the number of delay elements provided in the delay unit 20.

Accordingly, in the DLL circuit according to embodiments of the present invention, even when the phase of the reference clock leads the phase of the feedback clock in an operation of matching the phase of the reference clock with the phase of the feedback clock to generate a locked clock, it is possible to reduce the amount of delay time to be given to the feedback clock. In addition, it is possible to reduce the number of delay elements provided in a delay unit of the DLL circuit, resulting in an increase in area margin.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

As described above, in the DLL circuit and the method of controlling the DLL circuit according to the embodiments of the present invention, the phase of the internal clock is selectively changed according to the phase difference between the reference clock and the feedback clock, the frequency of an external clock, and a test mode to generate the feedback clock. Therefore, it is possible to reduce the amount of delay time given to lock the reference clock and the feedback clock and to reduce the number of delay elements provided in a delay unit, which results in an increase in area margin.

What is claimed is:

1. A delay locked loop (DLL) circuit comprising:
   a phase conversion control unit configured to generate first and second phase conversion control signals for defining to invert or not a delay clock according to a determination result generated by determining whether a frequency of an external clock exceeds a predetermined frequency in response to a plurality of CAS latency signals;
   a phase converting unit configured to invert a phase of the delay clock in response to the first phase conversion control signal or the second phase conversion control signal, to transmit the inverted delay clock or the delay clock to a delay compensating unit; and
   wherein the phrase conversion control unit is configured to generate the first and second phase conversion control signals in response to input of first and second test signals.

2. The DLL circuit of claim 1,
   wherein whether or not the frequency of the external clock exceeds the predetermined frequency is determined by a length of a CAS latency set by the plurality of CAS latency signals.

3. The DLL circuit of claim 1,
   wherein the phase conversion control unit is configured to invert the delay clock when a phase of a reference clock leads the phase of a feedback clock, and output the delay clock without inversion when the phase of the feedback clock leads the phase of the reference clock on the basis of the first or second phase conversion control signal.

4. The DLL circuit of claim 1,
   wherein the phase conversion control unit comprises:
   a test mode setting unit configured to receive the first and second test signals to generate a test mode signal;
   a first signal input unit configured to receive the test mode signal and some of the plurality of CAS latency signals having lengths smaller than a predetermined length and to produce an output signal;
   a second signal input unit configured to receive the test mode signal and some of the plurality of CAS latency signals having lengths equal to or larger than the predetermined length and to produce an output signal;
   a first signal generating unit configured to combine the output signal of the first signal input unit with the first test signal to generate the first phase conversion control signal; and
   a second signal generating unit configured to combine the output signal of the second signal input unit with the second test signal to generate the second phase conversion control signal.

5. The DLL circuit of claim 1,
   wherein the phase converting unit comprises:
   a non-inverting unit configured to output the delay clock as the delay clock without inversion when the first phase conversion control signal is enabled; and
   an inverting unit configured to invert the delay clock when the second phase conversion control signal is enabled, and output the inverted delay clock.

6. The DLL circuit of claim 1, further comprising:
   a clock buffer that converts an amplitude of the external clock to generate a reference clock; and
   a delay unit that delays the reference clock in a push or pull manner in response to the input of a delay control signal to generate the delay clock.

7. The DLL circuit of claim 6,
   wherein the delay compensating unit delays the delay clock output from the phase converting unit to generate a feedback clock in order to compensate for the delay time given by delay elements provided on a transmission path of the delay clock to a data output buffer.

8. The DLL circuit of claim 7, further comprising:
   a phase comparing unit configured to compare a phase of the reference clock with a phase of the feedback clock to generate the phase comparison signal; and
   a delay control unit configured to generate the delay control signal in response to the input of the phase comparison signal and transmit the generated signal to the delay unit.

9. A method of controlling a delay locked loop (DLL) circuit, comprising:
   generating first and second phase conversion control signals for defining to invert or not a delay clock according to a determination result generated by determining whether a frequency of an external clock is larger than a predetermined frequency in response to a CAS latency;
   inverting a phase of a delay clock according to an enabling of the first phase conversion control signal or an enabling of the second phase conversion control signal and outputting inverted the delay clock to a delay compensating unit; and
   wherein the generating of the first and second phase conversion control signals further comprises generating the first and second phase conversion control signals in response to input of first and second test signals.

10. The method of controlling a DLL circuit of claim 9, wherein whether the frequency of the external clock is larger than the predetermined frequency is determined by a length of the CAS latency.

11. The method of controlling a DLL circuit of claim 9, wherein the inverting of the phase of the delay clock comprises inverting the delay clock when a phase of a reference clock leads a phase of a feedback clock, and outputting the delay clock without inversion when the phase of the feedback clock leads the phase of the reference clock on the basis of the first and second phase conversion control signals.

12. The method of controlling a DLL circuit of claim 9, wherein the generating of the first and second phase conversion control signals includes:
receiving the first and second test signals to generate a test mode signal;
receiving the test mode signal and some of a plurality of CAS latency signals having lengths smaller than a predetermined length;
receiving the test mode signal and some of the plurality of CAS latency signals having lengths equal to or larger than the predetermined length;
combining the first test signal with an output signal received from the CAS latency signals having lengths smaller than the predetermined length to generate the first phase conversion control signal; and
combining the second test signal with an output signal received from the CAS latency signals having lengths equal to or larger than the predetermined length to generate the second phase conversion control signal.

13. The method of controlling a DLL circuit of claim 9, wherein the inverting of the phase of the delay clock comprises:
outputting the delay clock without inversion when the first phase conversion control signal is enabled; and
inverting the delay clock when the second phase conversion control signal is enabled and outputting the inverted delay clock.

14. The method of controlling a DLL circuit of claim 9, further comprising:
before the generating of the first and second phase conversion control signals,
converting an amplitude of the external clock to generate a reference clock; and
delaying a reference clock in a push or pull manner in response to the input of a delay control signal to generate the delay clock.

15. The method of controlling a DLL circuit of claim 14, wherein the delay compensating unit is configured to delay the controlled delay clock to generate a feedback clock in order to compensate for a delay time given by delay elements provided on a transmission path of the delay clock to a data output buffer.

16. The method of controlling a DLL circuit of claim 15, further comprising:
comparing the reference clock with the feedback clock to generate the phase comparison signal; and
generating the delay control signal in response to the input of the phase comparison signal.

\* \* \* \* \*